United States Patent [19]
Yao

[11] Patent Number: 6,050,848
[45] Date of Patent: *Apr. 18, 2000

[54] ADAPTER BASE FOR RECEIVING A CARTRIDGE MEMORY

[76] Inventor: Li-Ho Yao, 4th Fl., No. 99-4, Tungan St., Taipei, Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 08/962,815

[22] Filed: Nov. 3, 1997

[51] Int. Cl.⁷ .................................................... H01R 13/00
[52] U.S. Cl. ............................................ 439/483; 439/946
[58] Field of Search .............................. 439/483, 928.1, 439/361, 638, 357, 350; 361/728, 729, 730, 747, 683, 684, 752, 754, 731, 737, 685

[56] References Cited

U.S. PATENT DOCUMENTS

| | | | |
|---|---|---|---|
| 4,480,835 | 11/1984 | Williams | 439/928.1 |
| 5,155,663 | 10/1992 | Harase | 361/395 |
| 5,446,622 | 8/1995 | Landry et al. | 361/737 |
| 5,519,571 | 5/1996 | Shieh | 439/638 |
| 5,726,867 | 3/1998 | Zarreii | 361/818 |
| 5,757,622 | 5/1998 | Tanaka et al. | 361/737 |
| 5,759,104 | 6/1998 | Shirae et al. | 439/361 |

OTHER PUBLICATIONS

Communication and European Search Report, dated Apr. 17, 1998 (3 pgs.).

*Primary Examiner*—Paula Bradley
*Assistant Examiner*—Ross Gushi
*Attorney, Agent, or Firm*—Fitch, Even, Tabin & Flannery

[57] ABSTRACT

An adapter base for receiving a cartridge memory is disclosed, in which a recess is defined in the adapter base by two opposed side walls, a bottom wall and an end wall contiguous with the side walls. A cartridge memory is inserted into the adapter base, and the assembly of the adapter base. The cartridge memory can be received in at least two devices with recesses dimensioned respectively according to the memo cartridge alone or the adapter base containing the memo cartridge.

2 Claims, 4 Drawing Sheets

ADAPTER BASE FOR RECEIVING A CARTRIDGE MEMORY

BACKGROUND OF THE INVENTION

1. The Field of the Invention

The present invention relates to an adapter base, and more particularly to an adapter base for receiving a cartridge memory to be used in various related application objects.

2. Description of the Related Art

Information technology increasingly filters down from high technology applications to common, everyday devices, and consumer goods such as an electronic dictionary, microcomputer-controlled appliances and electronic game machinery are practical examples of applying the information technology.

Presently, a recording watch has appeared on the market. In fact, techniques in digital audio and recording are well known in the art, but the know-how of the techniques exists in how to design a corresponding circuit to fit in such a small space as defined by a watch. Referring to the recording watch as described above, if the recording time is short, the audio data can be directly stored in a conventional internal memory on a circuit board, but, if the recording time required is long, the memory space of the conventional internal memory is not sufficient. Under this circumstance, a cartridge memory can be used to extend the memory capacity. As shown in FIG. 6, a cartridge memory 90 is externally inserted into a recording watch 80 to provide a larger memory space.

The size of the cartridge memory 90 described above has to be greatly reduced to match with the dimensions of the recording watch 80, and although it is not difficult to modify the memory space of the cartridge memory 90 for the existing information industrial technology, a problem of being compatible in dimension has emerged. So far, the cartridge memory has been widely used, for example, a digital camera applies the same technology as a converting medium between itself and a computer. The configurations between the cartridge memory of the digital camera and the one that the recording watch uses are identical, but they have a remarkable distinction between their specifications. In addition to the memory capacity, they are also different in their sizes. Though they are both compact cartridge memories, they can not be used compatibly since they are different in their dimensions. Therefore, there is a long and unfilled need for an adapter base which receives a cartridge memory whereby the cartridge memory can be received in at least two devices with recesses dimensioned respectively according to the memo cartridge only and the adapter base containing the memo cartridge.

SUMMARY OF THE INVENTION

The present invention is directed to an adapter base for receiving a cartridge memory.

An objective of the present invention is to provide an adapter base for receiving a cartridge memory whereby the assembly of the adapter base and the cartridge memory conforming to a uniform specification compatible with related application objects.

In accordance with one aspect of the invention, there is provided an adapter base for receiving a cartridge memory including an adapter base having a recess defined by a pair of opposed side walls, a bottom wall and an end wall contiguous with the side walls formed thereon and a cartridge memory to be plugged into the adapter base. A lip is formed on top edge of the end wall of the adapter base and two opposed resilient hooks are respectively formed in two chambers correspondingly defined in the side walls of the adapter base. Each resilient hook has an oblique top face and a shoulder defined below the oblique top face.

In accordance with the other aspect of the invention, there is provided an adapter base for receiving a cartridge memory, in which the adapter base further includes a pair of L-shaped buffers respectively formed on an end of the corresponding side wall thereof and the cartridge memory has a pair of multisectional tenons respectively extending from two opposed side faces thereof and corresponding to the L-shaped buffers.

BRIEF DESCRIPTION OF THE DRAWINGS

The above objective, other features and advantages of the present invention will become more apparent by describing in detail the preferred embodiment thereof with reference to the attached drawings, in which.

DETAILED DESCRIPTION OF THE PREFERRED EMBODIMENT

Figure 1:
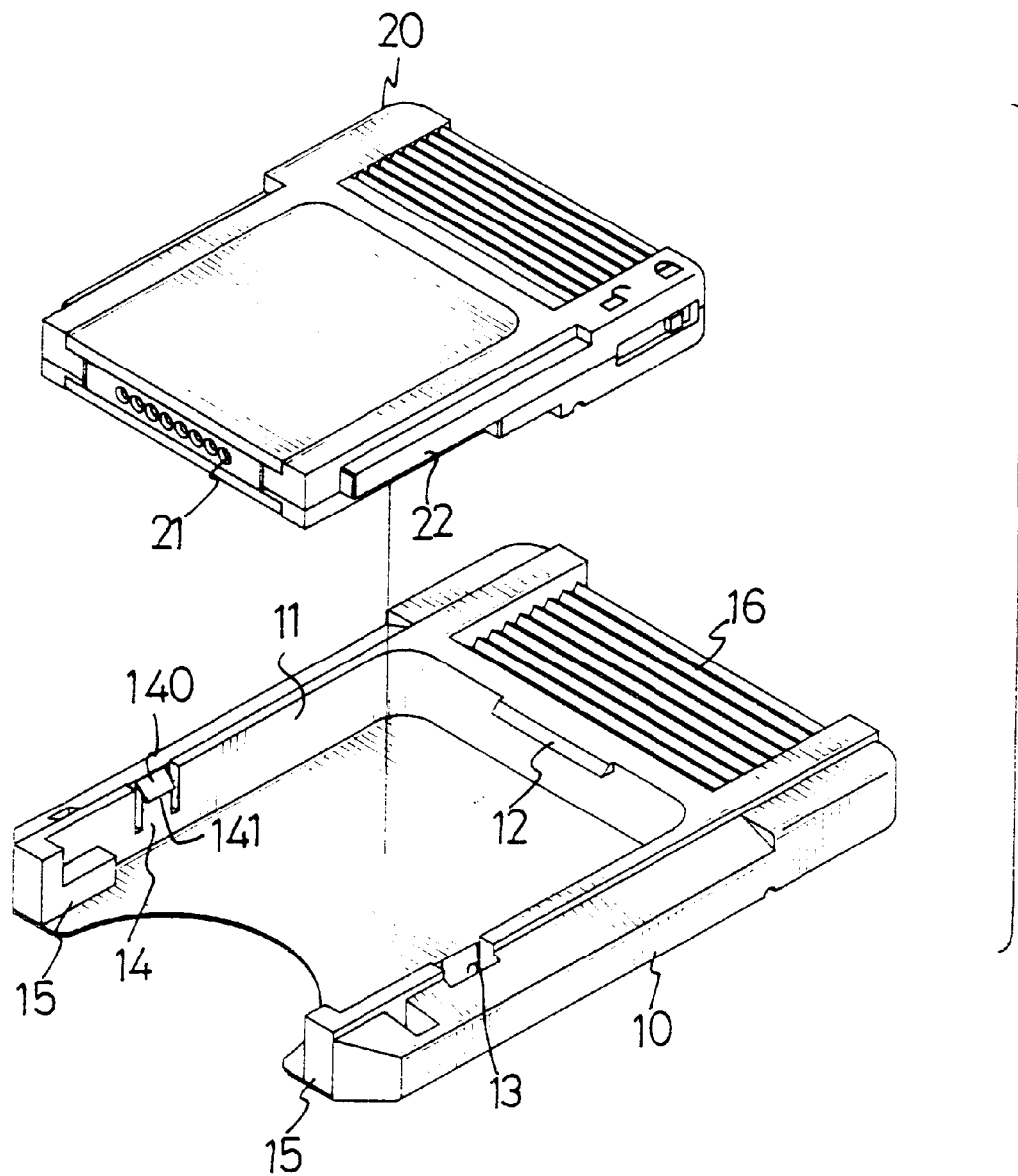
FIG. 1 shows an exploded view of an adapter base for receiving a cartridge memory in accordance with the present invention.

Referring to FIG. 1, the structure of a preferred embodiment in accordance with the present invention includes an adapter base 10 and a cartridge memory 20 to be contained in the adapter base 10 for being compatible with other related application objects.

A recess 11 is defined in the adapter base 10 by two opposed side walls, a bottom wall and an end wall contiguous with the side walls. An opening is defined in the adapter base 10 and is opposite to the end wall. The recess 11 is configured to snugly receive the cartridge memory 20. The depth of the recess 11 is greater than the height of the cartridge memory 20. A semi-circular cutout is defined in the bottom wall partly defining the recess 11 and is in communication with the opening. In this preferred embodiment, the cartridge memory 20 is downwardly pressed into the recess 11.

A lip 12 is formed on a top edge of the end wall of the adapter base 10. Two opposed resilient hooks 14 are respectively formed in two chambers 13 correspondingly defined in the side walls of the adapter base 10, and near the opening. Each resilient hook 14 has an oblique top face 140 and a shoulder 141 defined below the oblique top face 140. Each shoulder 141 faces the recess 11. The oblique top face 140 is apt to allow the cartridge memory 20 pass to the shoulder 141 of the resilient hook 14 when in installation.

Two L-shaped buffers 15 are respectively formed on an end of the corresponding side wall and are adjacent to the opening for preventing the cartridge memory 20 from longitudinally slipping out of the recess 11 of the adapter base 10.

A grip portion with ridges 16 formed thereon is provided at an end opposite the opening and adjacent to the end wall of the adapter base 10 for a user to hold the adapter base 10 when inserting or extracting the cartridge memory 20.

A pair of multisectional tenons 22 respectively extend from two opposed side faces of the cartridge memory 20 and correspond to the side walls of the adapter base 10. Each tenon 22 is configured to be matingly received between the corresponding L-shaped buffer 15 and the end wall of the adapter base 10. A first end face of the each multisectional tenon 22 abuts an upright portion of the corresponding L-shaped buffer and a second end face of each tenon 22 abuts the end wall of the base 10.

The cartridge memory 20 includes a front face and a rear face. A row of connectors 21 is disposed in the front face of the cartridge memory 20 for providing a signal connection between the cartridge memory 20 and other application objects.

Figure 4:
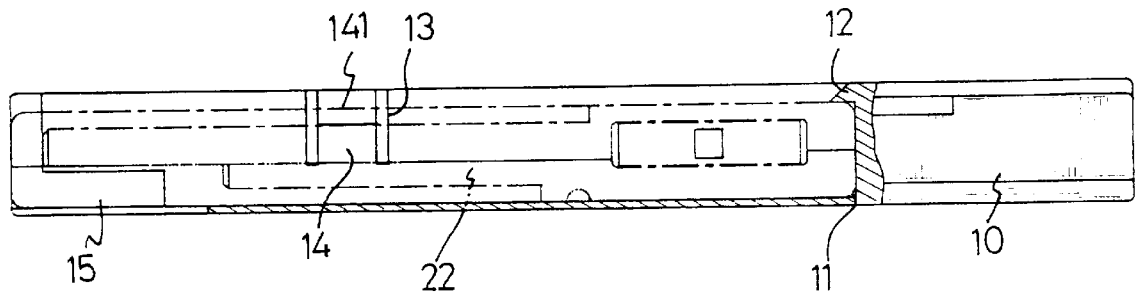
FIG. 4 is another cross-sectional view showing the combination structure after the cartridge memory has been filtered into the adapter base.
Figure 3:
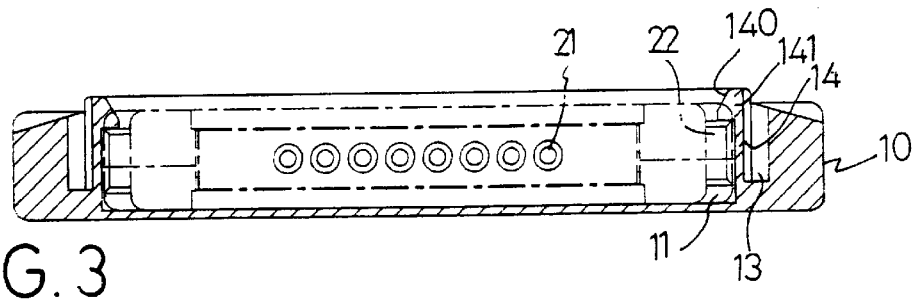
FIG. 3 is a cross-sectional view showing the combination structure after the cartridge memory has been filtered into the adapter base.
Figure 2:
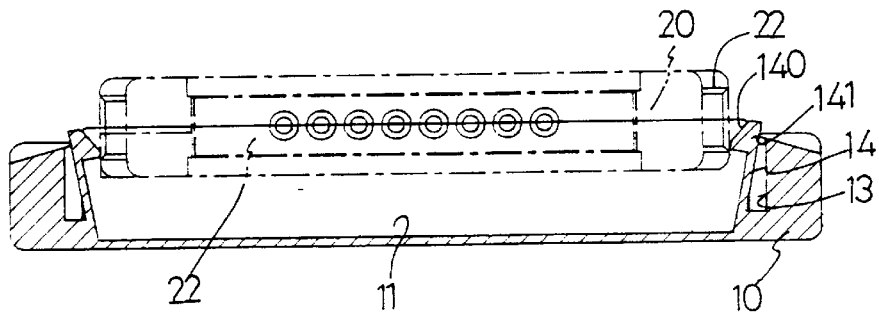
FIG. 2 is a cross-sectional view showing the combination structure when the cartridge memory is being filtered into the adapter base.
Figure 5:
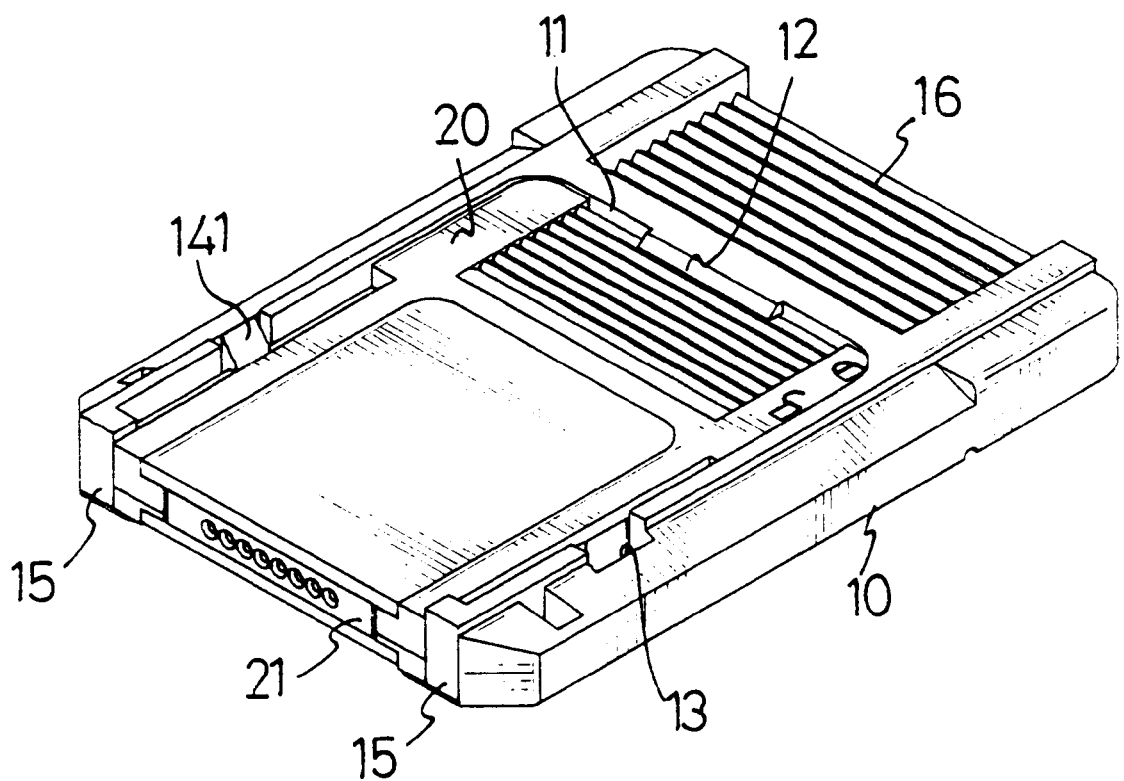
FIG. 5 shows the combination structure after the cartridge memory has been assembled into the adapter base.
Figure 6:
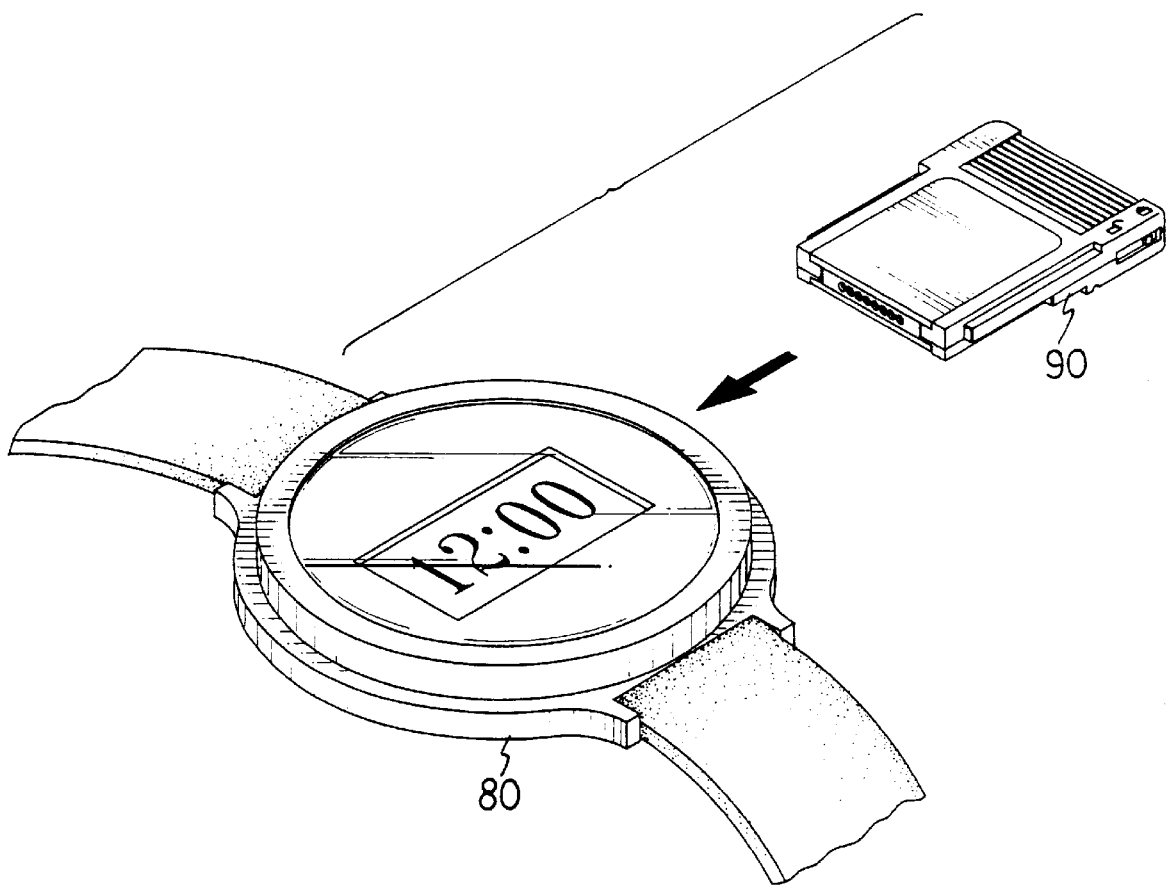
FIG. 6 shows a cartridge memory being externally inserted into a conventional recording watch.

In assembly, first, the cartridge memory 20 is inclined such that the rear face thereof is hooked under the lip 12 of the base 10 which is held at the grip portion by a user. The front face of the cartridge memory 20 is swung down towards the L-shaped buffer 15 whereby the tenons 22 slide down the oblique top faces 140 of the resilient hooks 14, pushing the resilient hooks 14 into the chambers 13, as shown in FIG. 2. Once a top face of the cartridge memory 20 has reached below each shoulder 141 of the resilient hooks 14, the resilient hooks 14 snap back to their original positions whereby the cartridge memory 20 is securely engaged in the base 10, as shown in FIGS. 3 and 4. FIG. 5 shows a configuration after the above-described adapter base 10 and the cartridge memory 20 have been combined.

To remove the cartridge memory 20, a user presses the resilient hooks 14 back into the chambers 13 and pushes upward against a portion of a bottom face of the cartridge memory 20 exposed by the cut-out of the base 10.

Accordingly, the present invention provides an adapter base for receiving a cartridge memory to become a uniform specification required by other related application objects.

While the present invention has been explained in relation to its preferred embodiment, it is to be understood that various modifications thereof will be apparent to those skilled in the art upon reading this specification. Therefore, it is to be understood that the invention disclosed herein is intended to cover all such modifications as fall within the scope of the appended claims.

I claim:

1. A cartridge memory assembly comprising:

an adapter base having a recess defined by a pair of opposed side walls, a bottom wall and an end wall contiguous with the side walls formed thereon;

a lip formed on a top edge of the end wall;

two opposed resilient hooks respectively formed in two chambers correspondingly defined in the side walls;

a cartridge memory having a front face with a plurality of connectors disposed thereon for providing a signal connection to related application objects, a rear face opposed to said front face, and two opposed side faces with a pair of multisectional tenons, respectively extended therefrom, said cartridge memory being vertically insertable into said adapter base in such a manner that said rear face is hooked under said lip and said pair of multisectional tenons snap into said two resilient hooks; and a pair of L-shaped buffers respectively formed on an end of the corresponding side wall thereof, said pair of multisectional tenons abutting said pair of L-shaped buffers for preventing said cartridge memory from longitudinally slipping out of said recess of said adapter base;

said cartridge memory assembly conforming to a uniform specification compatible with related application objects.

2. The cartridge memory assembly as claimed in claim 1, wherein each of said two opposed resilient hooks has an oblique top face and a shoulder defined below the oblique top face.

* * * * *